United States Patent
Wood et al.

[11] Patent Number: 6,092,230
[45] Date of Patent: Jul. 18, 2000

[54] METHOD AND APPARATUS FOR DETECTING BAD FRAMES OF INFORMATION IN A COMMUNICATION SYSTEM

[75] Inventors: Sandra L. Wood, Kenosha, Wis.; Thomas J. Kundmann, Streamwood, Ill.; Lee M. Proctor, Elgin, Ill.; Ken Stewart, Palatine, Ill.

[73] Assignee: Motorola, Inc., Schaumburg, Ill.

[21] Appl. No.: 08/121,809

[22] Filed: Sep. 15, 1993

[51] Int. Cl.[7] .................................................. H03M 13/00
[52] U.S. Cl. ........................... 714/755; 714/786; 714/788
[58] Field of Search .............................. 371/37.4, 43, 45; 714/755, 786, 788

[56] References Cited

U.S. PATENT DOCUMENTS

| | | | |
|---|---|---|---|
| 3,806,647 | 4/1974 | Dohne et al. | 27/24 |
| 3,953,674 | 4/1976 | Fletcher et al. | 178/69.5 |
| 4,945,538 | 7/1990 | Patel | 371/43 |
| 5,113,400 | 5/1992 | Gould et al. | 371/43 |
| 5,255,343 | 10/1993 | Su | 395/2.51 |
| 5,321,705 | 6/1994 | Gould et al. | 371/43 |

OTHER PUBLICATIONS

"Radio Transmission and Reception," GSM Recommendation 5.05, Ver. 4.2.0, Apr. 1992, Cedex, France, pp. 16–17.
"Channel Coding," GSM Recommendation 5.03, Ver. 3.5.1, Jan. 1990, Cedex, France, entire document.

*Primary Examiner*—Emmanuel L. Moise
*Attorney, Agent, or Firm*—Richard A. Sonnentag; L. Bruce Terry

[57] ABSTRACT

A communication system implements detection of bad frames of information by utilizing multiple bit correction thresholds. Equipment used within the communication system adapts to different signaling environments by dynamically altering the bit correction threshold based on a history of the number of consecutive bad frames of information that have been previously erased and the number of bits corrected by a channel decoder (202). By implementing this dynamic bit correction threshold, sufficient bad frame indication (BFI) detection and receiver sensitivity can be obtained simultaneously, which results in an improved perceived audio quality to the end user.

14 Claims, 4 Drawing Sheets

TRANSMIT SIDE OF BASE-STATION/MOBILE STATION

METHOD AND APPARATUS FOR DETECTING BAD FRAMES OF INFORMATION IN A COMMUNICATION SYSTEM

FIELD OF THE INVENTION

The present invention relates generally to communication systems and more particularly to detection of bad frames of information in such communication systems.

BACKGROUND OF THE INVENTION

Communication systems, and more specifically digital cellular radiotelephone systems, employ speech and channel coding techniques to represent analog speech in a digital manner. Essentially, a portion of a waveform of analog speech is sampled, digitized and compressed into bits which digitally represent the analog waveform. A block (or frame in time division multiple access, TDMA, systems) of the sampled bits are then sent to a channel coder where additional processing is performed. The resulting output of the channel coder undergoes further processing, depending on the particular digital radiotelephone system, and is then transmitted to a receiving station over an air interface.

Due to the effects of multi-path, Rayleigh fading, etc, the block of bits representing the original analog waveform of speech has a high probability of being corrupted when the communications link is operating at or near its designed signalnoise ratio. Typical digital cellular radiotelephone systems incorporate a cyclic redundancy check (CRC) whereby the channel coder within the transmitter performs a type of degenerate cyclic coding on a portion of the bits to be transmitted (the portion of bits which are coded are typically the most perceptually significant speech bits). This results in the addition of a predetermined number of CRC parity bits to form a CRC codeword. Receivers receiving the transmitted CRC codeword check the codeword, and if incorrect, determine that the entire block of bits is corrupted. Once this determination is made, the block (or frame) of bits is erased.

In the Global System for Mobile Communications (GSM) Pan-European Digital Cellular (PEDC) radiotelephone system, a 3-bit CRC codeword is implemented giving a (53,50) shortened cyclic block code. An important measure of link and receiver performance in GSM is the "Bad Frame Indicator" or logical BFI flag. The BFI flag is asserted when any of the information bits comprising the 50 bits to which the block code is applied are received in error. GSM Recommendation 5.05, titled "Radio Transmission and Reception," version 4.2.0 dated April, 1992, specifies that, on average, less than one undetected bad speech frame (i.e., the BFI flag is not asserted when an information bit is received in error) in ten seconds be measured under certain signaling conditions. It is well recognized that the 3-bit CRC codeword that has been originally implemented is insufficient to meet the BFI specifications as defined in GSM Recommendation 5.05 because the (53,50) code is not sufficiently powerful to detect many bit error patterns which form valid codewords, and hence satisfy the CRC syndrome calculation.

Additional criteria can, however, be derived from other forward error correction (FEC) statistics to form a composite BFI flag. One such criteria, in addition to the CRC codeword, is a bit correction threshold. This approach exploits the fact the bits protected by the CRC are also encoded using a convolutional code. It is possible to estimate the channel symbol error rate of the convolutionally coded symbols by re-encoding the information sequence recovered by convolutional decoding. The accumulated number of re-encoded channel symbols found to be different from received symbols provides a useful indicator of information bit error performance (BER). It is therefore possible to compare this symbol error count (SEC) with a threshold—if the SEC exceeds the threshold, the BFI flag is asserted.

Use of the bit correction threshold with the CRC codeword improves some aspects of the performance of the BFI (i.e., to reduce the probability of missing bad frames), but may also increase the BFI false alarm rate under some circumstances. For example, as the error checking threshold is changed, there is an inverse relationship between the BFI falsing rate performance and carrier to interference (C/I) performance, which directly impacts the sensitivity of the receiver. In other words, the current error checking thresholds are unable to provide sufficient BFI detection and adequate receiver sensitivity simultaneously.

Thus, a need exists for a method and apparatus which provides sufficient BFI detection while maintaining adequate receiver sensitivity in a digital cellular radiotelephone system.

DETAILED DESCRIPTION OF A PREFERRED EMBODIMENT

A digital cellular radiotelephone system implements detection of bad frames of information by utilizing multiple bit correction thresholds in accordance with the invention. Equipment used within the digital cellular radiotelephone system adapts to different signaling environments by dynamically altering the bit correction threshold based on consecutive frame erasures and bits corrected by the channel decoder. By implementing this dynamic bit correction threshold, sufficient bad frame indication (BFI) detection and receiver sensitivity can be obtained simultaneously, which results in an improved perceived audio quality to the end user.

Figure 1:
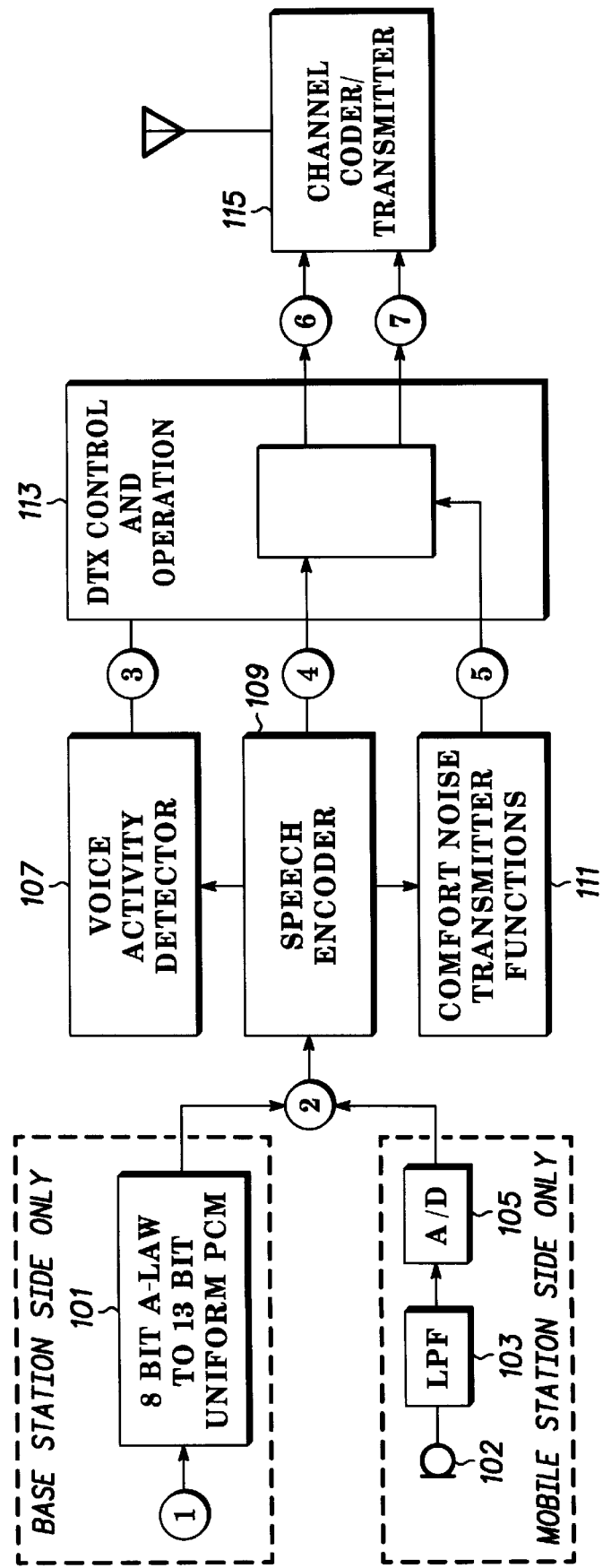
FIG. 1 generally depicts, in block diagram form, the transmit side of a base-station and/or a mobile station which performs channel coding on blocks of speech and frames the coded blocks accordingly into frames of information.
Figure 2:
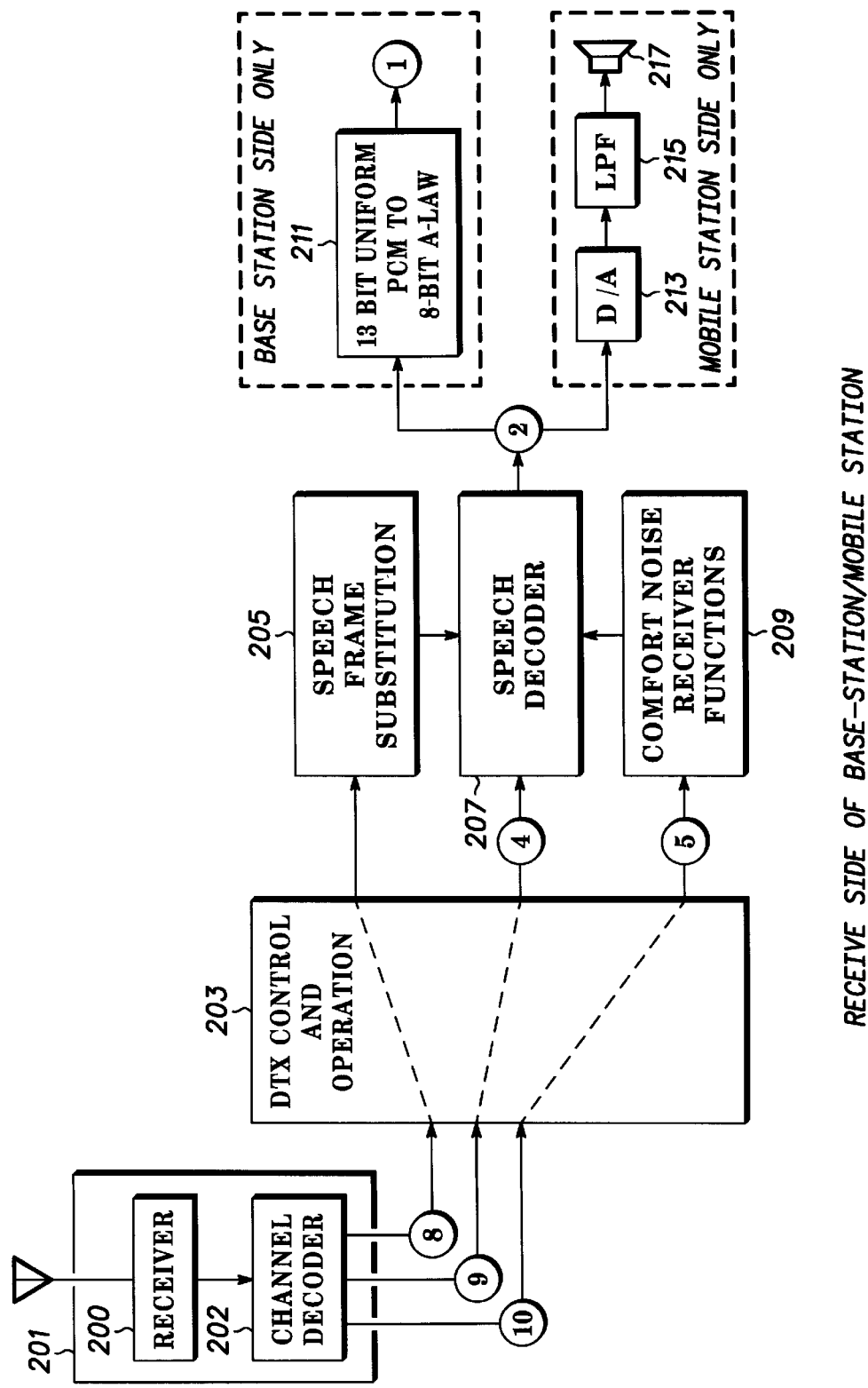
FIG. 2 generally depicts, in block diagram form, the receive side of a base-station and/or a mobile station which may beneficially implement detection of bad frames of information in accordance with the invention.

FIG. 1 generally depicts the transmit side of a base-station/mobile station while FIG. 2 depicts a receive side of a base-station/mobile station. Points 1–10, as depicted in FIG. 1 and FIG. 2, are described below.

(1) 8-bit/A law PCM 8000 samples/s (2) 13-bit uniform PCM, 8000 samples/s (3) Voice Activity Detect Flag (4) Encoded Speech, 50 frames/s, 260 bits/frame (5) Silence Descriptor (SID) frame, 260 bits/frame (6) Speech Flag, indicates whether information bits are speech or SID information (7) Information bits received from channel decoder (8) Information bits received from the channel decoder (9) Bad Frame Indicator (BFI) Flag

(10) Silence Descriptor (SID) Flag frame

Referring to FIG. 1, at point 1 of the base-station side only, 8-bit/A law PCM 8000 samples/s are converted to 13-bit uniform PCM by block 101. Likewise, on the mobile station side only, a microphone 102 accepts analog speech, which is low pass filtered by LPF 103 and subsequently converted to 13 bit uniform PCM by analog-to-digital (A/D) converter (105). The base-station and mobile stations are depicted in FIG. 1 for explanation purposes only; they are not physically connected as shown in FIG. 1. Continuing, 13-bit uniform PCM enters a speech coder 109 which outputs, at point 4, encoded speech at 50 frames/s, 260 bits/frame. Also output from speech coder 109 is a signal which enters voice activity detector 107. Voice activity detector 107 takes a set of parameters from speech encoder 109 and determines whether or not a current 20 ms speech coder frame contains speech. Output from voice activity detector, at point 3, is consequently a voice activity detect flag. Also output from speech encoder 109 is a signal which enters comfort noise transmitter functions block 111. Block 111 inserts comfort noise in the receiver to maintain a constant perceived noise level between keyed ("on") and unkeyed ("off") signals. The steps involved in inserting comfort noise are: characterizing the acoustic background noise in the transmitter, encoding and decoding the noise parameters in the speech coder and decoder (silent descriptor, SID, frames) and generating the comfort noise in the receiver.

Output from block 111, at point 5, is a SID frame of 260 bits/frame. Each of the outputs at points 3–5 enter discontinuous transmission (DTX) control and operation block 113. DTX is a mode of operation where a transmitter is switched "on" only for those speech frames containing information. Primarily, this is done for two reasons: (1) to prolong the battery life of a mobile or allow for use of a smaller battery, and (2) to reduce the average interference level over the air-interface, thus leading to better spectrum efficiency. Continuing, output from block 113, at point 6, is a speech flag, which indicates whether information bits are speech or SID information. Also output from block 113, at point 7, are information bits which are delivered to the channel coder of channel coder/transmitter block 115. Block 115 performs channel coding on the bits output at point 7, and correspondingly transmits the coded channel to a receiver within the digital cellular radiotelephone system.

As shown in FIG. 2, a signal transmitted by the base-station/mobile station of FIG. 1 is received by receiver 200. Block 201 includes receiver 200 to receive the transmitted signal and channel decoder circuitry 202 to decode the channel coded by channel coder/transmitter 115. Output from block 201, at point 8, are information bits which have been decoded by the channel decoder 202. Likewise, at point 9, a bad frame indicator (BFI) flag is output, as is a silence descriptor (SID) flag frame at point 10. Outputs from block 201 at points 8–10 are input into DTX control and operation block 203 for the receive side. Block 203 performs similar functions as block 113 of FIG. 1. Output from block 203 is a signal which is input into speech frame substitution block 205. Block 205 utilizes prediction techniques for frame insertion to account for losses of a single frame. In addition, muting techniques are used to indicate that several consecutive frames have been lost. Output from block 205 is input into speech decoder 207 which also has as input, at point 4, encoded speech at 50 frames/s, 260 bits / frame. A SID frame at 260 bits/frame is likewise output from block 203 at point 5. The SID frame is input into comfort noise receiver functions block 209 which performs similar functions as block 111 of FIG. 1. Output from block 209 is likewise input into speech decoder 207 which decodes the corresponding speech and outputs 13-bit uniform PCM at 8000 samples/s. If the receive side is implemented in a base-station, output from point 2 enters block 211 where the 13-bit uniform PCM is converted to 8-bit/A law PCM at 8000 samples/s. If the receive side is implemented in a mobile station, output from point 2 is input into a digital-to-analog (D/A) converter 213 which converts the digitized samples into analog speech. The analog speech is low pass filtered by LPF 215 and sent to speaker 217 where it is transmitted to a user as the original speech signal that was accepted at point 1 of FIG. 1.

Figure 3:
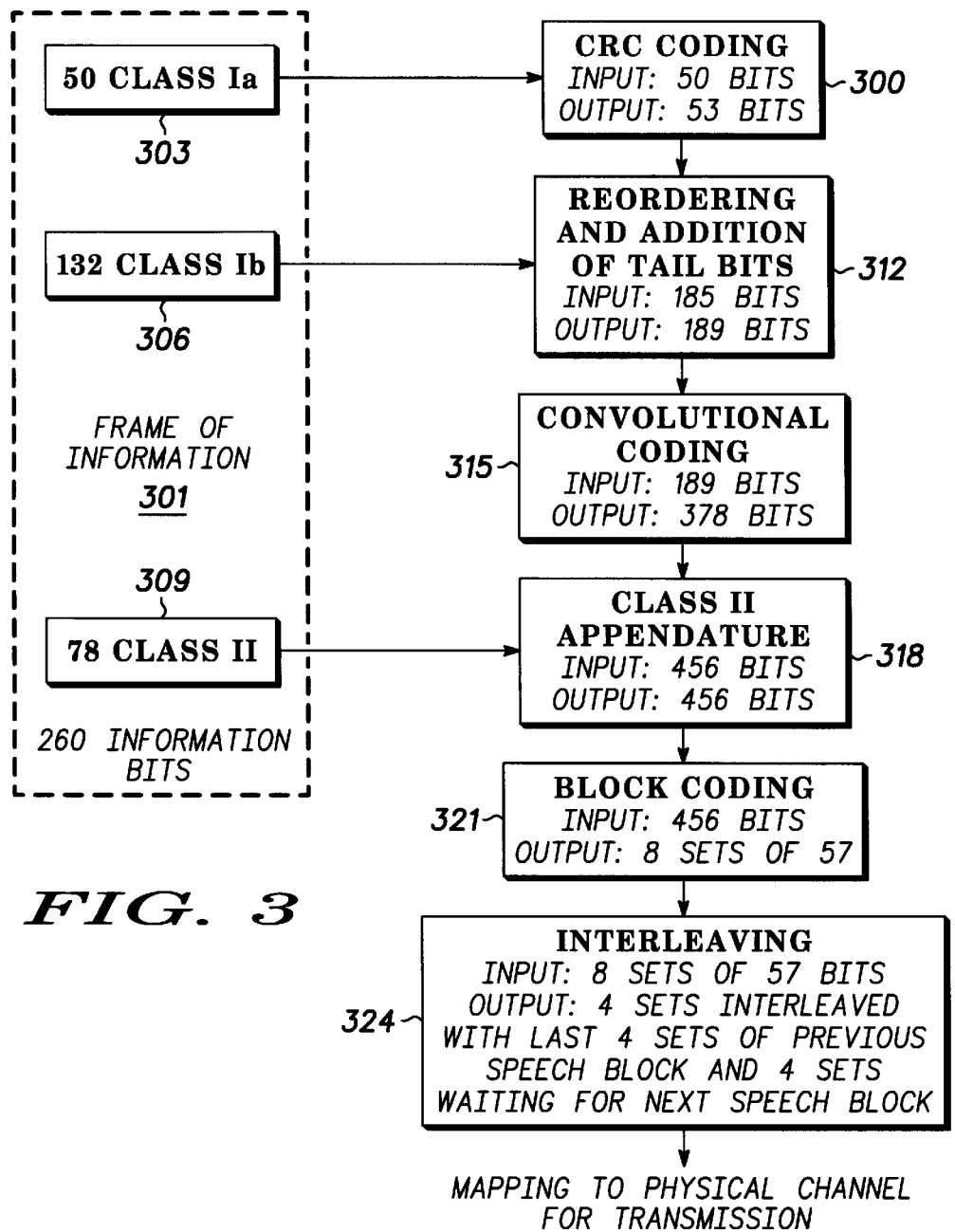
FIG. 3 generally illustrates, in flow diagram form, the channel coding scheme employed by the channel coder depicted in FIG. 1.

FIG. 3 generally illustrates, in flow diagram form, the channel coding scheme employed by the channel coder/transmitter 115 depicted in FIG. 1. In the preferred embodiment, the digital cellular radio telephone system is the GSM digital cellular radiotelephone system. For a detailed explanation of channel coding in the GSM digital cellular radiotelephone system, reference is made to GSM recommendation 5.03, titled "Channel Coding," version 3.5.1 dated January, 1990. Recalling that point 4 of FIG. 1 consists of frames of information comprising 260 information bits delivered from speech coder 109, this is considered a speech block by a speech coder 109 operating at full rate speech. Before being sent to the channel coder/transmitter 115, however, the 260 information bits within the frame of information are reordered based upon importance of the bits. The bits are separated into three classes (Class Ia, Class Ib and Class II). In the preferred embodiment, the frame of information consists of the Class Ia, Class Ib and Class II bits and the frame is determined to be bad (and erased) in accordance with the invention. Other frames of information may be utilized for other systems. Also, in the preferred embodiment, the frame of information is a frame of speech information, however the frame is not precluded from being a frame of data information in alternate embodiments. Continuing, the separation of bits by importance is not based upon what part of speech the bit was derived from, but rather the importance of the variable or coefficient it came from within speech encoder 109.

Referring to FIG. 3, 50 Class Ia information bits 303 undergo CRC coding which result in 53 bits at the output of block 300. The 50 Class Ia information bits 303 are considered the most important of the information bits and therefore have more protection than the rest of the bits within frame of information 301. A detailed description of CRC coding is given in GSM recommendation 5.05, titled "Radio Transmission and Reception," version 4.2.0 dated April, 1992. Continuing, output from block 300, along with 132 Class Ib information bits 306 are input into block 312 where the bits are reordered and additional tail bits are added. The resulting 189 bits output from block 312 undergo convolutional coding in block 315 resulting in an output from block 315 of 378 bits. The remaining 78 Class II information bits 309 are appended to the bits being output from block 315 to produce 456 bits being output from block 318. These 456 bits undergo block coding in block 321 whereby the input of 456 bits results in an output of 8 sets of 57 bits each. The 8 sets of 57 bits enter block 324 where 4 sets are interleaved with the last 4 sets of a previous speech block and the remaining 4 bursts wait for the next speech block. Output from block 324 is then mapped to a physical channel for transmission by transmitter 115.

As previously stated, the 3-bit CRC codeword is insufficient to meet the bad frame indication (BFI) specifications as defined in GSM recommendation 5.05. The CRC is insufficient due to its limited error detection capability. Severely corrupted frames (eg. when no desired signal is input to the receiver) can still pass the CRC check. A bit correction threshold can be implemented with the 3-bit CRC codeword to meet the BFI requirements of the system. The bit correction threshold is a threshold based on the number of bits which are corrected by an error correction algorithm running within channel decoder 202. In the preferred embodiment, the error correction algorithm is a Viterbi algorithm, which is a well known technique to those of ordinary skill in the art. In its original version, channel decoder 202 erased speech frames in which more than 48 bits were corrected by the Viterbi algorithm. This resulted in a falsing rate of one frame every 15 seconds. In other words, with no signal present to the receiver, one frame was not erased (or one frame was passed as good) every 15 seconds; this barely meets the specification of one false detection every 10 seconds (on average). Even at one false detections every 15 seconds, a perceptible degradation in audio quality is presented to the end user.

In addition, other problems with the CRC codeword/single bit correction threshold exist as previously stated. The bit correction threshold can be increased to improve co-channel interference performance, but at the expense of the BFI rate. This occurs since the symbol error count is dependent on the pattern of information bits (and hence channel coded symbols) as well as the number of channel coded symbols which are received in error. Since the information pattern is essentially random, the SEC can be viewed as a random variable. Also the SEC applies to both class Ia and Ib bits—errors in class Ib bits may increase the SEC and indicate erasure when the class Ia bits were in fact correct. As such the SEC threshold test can be assigned a false alarm rate (BFI indicated when no class Ia errors are present), and a missed alarm rate (BFI not indicated when errors are present). Increasing the threshold reduces the number of false alarms, thereby indicating improved receiver sensitivity. The number of missed alarms increases, however, thereby increasing the number of undetected BFI's.

Figure 4:
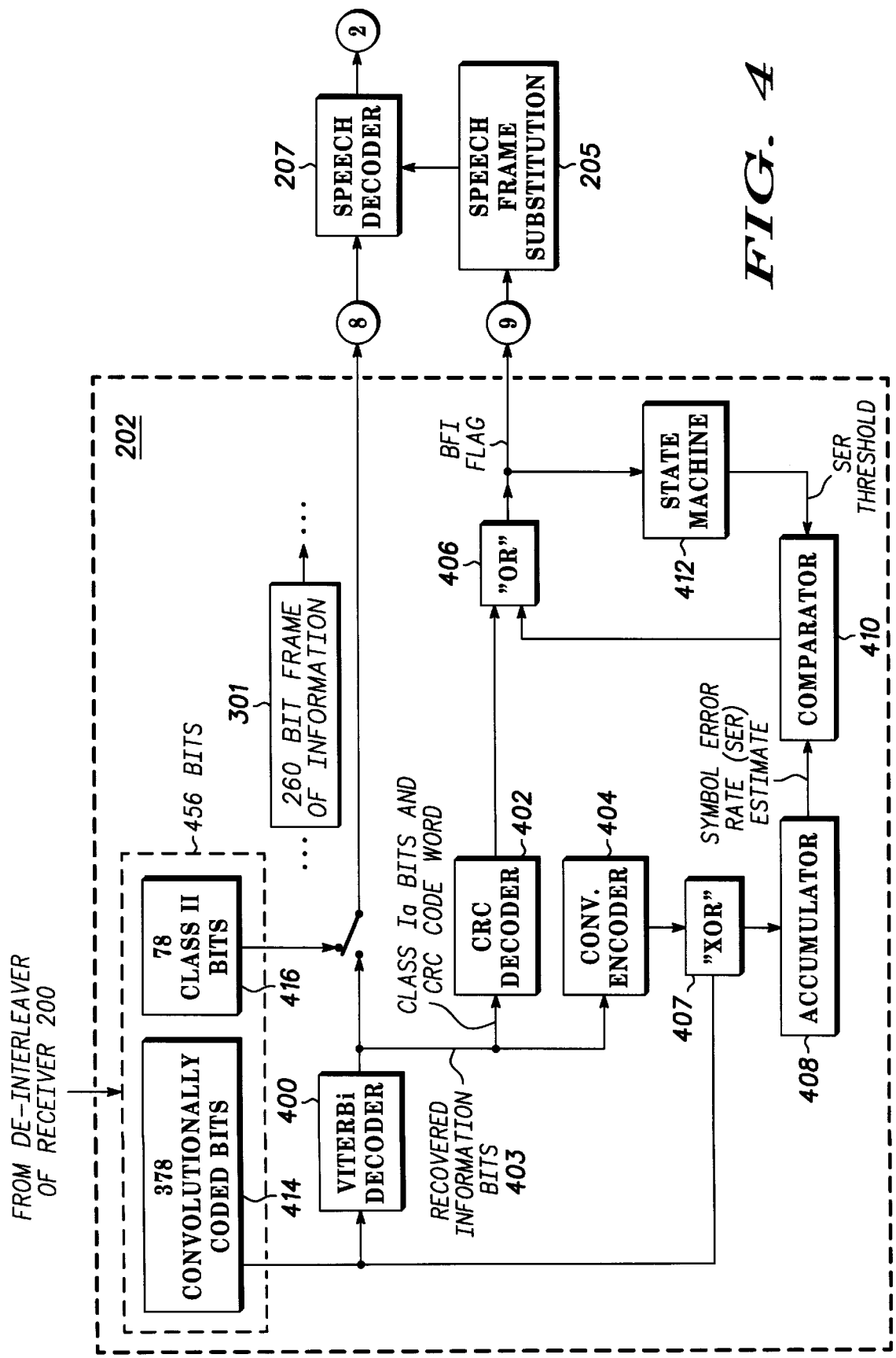
FIG. 4 generally depicts, in block diagram form, the channel decoder portion for detection of bad frames of information in accordance with the invention.

FIG. 4 generally depicts, in block diagram form, channel decoder 202 for detection of bad frames of information in accordance with the invention. The method and apparatus in accordance with the invention consists of changing the bit correction threshold based on a consecutive number of good frames and/or a consecutive number of bad frames received as determined by channel decoder 202. In theory, the number of bit correction states and the number of consecutive frames necessary to transition from state-to-state is unlimited. In reality, a 2-state system yields adequate performance with a minimum of complexity.

When receiver 200 receives the transmitted signal, receiver 200 demodulates, deinterleaves and descrambles the signal and provides 456 bits to the channel decoder 202 for purposes of channel decoding. Referring to FIG. 4, the 456 bits are comprised of 378 convolutionally coded bits 414 and 78 Class II bits 416. In an ideal signaling environment, the 456 bits presented to channel decoder 202 would be the output from block 318 of FIG. 3; in hostile signaling environments such as cellular radiotelephone systems, a number of bits remain the same but some bits may be received in error. Continuing, bits 414 are decoded by Viterbi decoder 400 to produce recovered information bits 403 which represent the original Class Ia and Class Ib bits. The 50 Class Ia bits and its 3-bit CRC codeword are presented to CRC decoder 402. CRC decoder 402 decodes the 3-bit CRC codeword in a manner almost identical to the CRC encoder structure which occurs in block 300 of FIG. 3 as one skilled in the art will appreciate. A value "1" output from CRC decoder 402 implies code failure, and the BFI flag is set. As well as computing the CRC decoder 402 output, channel decoder 202 re-encodes the output of Viterbi decoder 400 in convolutional encoder 404 for a comparison with the received convolutionally encoded bits 414. The number of encoded symbol errors is accumulated by accumulator 408 for each frame of information to form the symbol error rate (SER). The SER is then compared in comparator 410 with a bit correction threshold (SER threshold) generated by a state machine 412 which has monitored the history of the BFI. In the preferred embodiment, state machine 412 is a 56001 Digital Signal Processor (DSP) from Motorola. If the SER exceeds the current threshold, the BFI flag is again asserted. The decoded information bits exiting Viterbi decoder 400 and the uncoded Class II bits 416 are then passed to speech decoder 207 as a 260 bit frame of information, as is the BFI flag (via block 205). Speech coder 207 will either erase the frame of information or pass the frame of information based on the status of the BFI flag.

Figure 5:
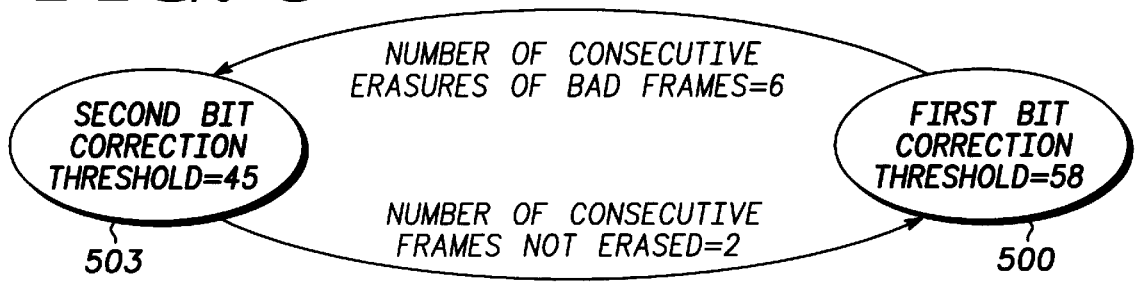
FIG. 5 generally depicts a state diagram of use of multiple thresholds to detect bad frames of information in accordance with the invention.

As previously stated, increasing the bit correction threshold provides adequate co-channel interference performance but does not provide adequate BFI rate performance. As such, multiple bit correction thresholds are employed within channel decoder 202 in accordance with the invention. Referring to FIG. 5, in the preferred embodiment a first bit correction threshold at state 500 is 58 bits corrected by the Viterbi algorithm within channel decoder 202. State 500 is a more generous state than state 503 in that a bit correction threshold of 58 is less likely to erase a frame since the channel decoder 202 is allowed to correct a greater number of bits before providing a BFI. However, if at least two (2) consecutive erasures of bad frames occur, a second bit correction threshold at state 503 is utilized. In the preferred embodiment, the number of consecutive erasures of bad frames which will initiate a state change from state 500 to state 503 is the consecutive erasure of 6 bad frames. Likewise in the preferred embodiment, the second bit correction threshold at state 503 is 45 bits corrected by the Viterbi algorithm within channel decoder 202. Once at state 503, at least two (2) consecutive frames not erased (i.e., good frames) are required to return the threshold to the first bit correction threshold. In the preferred embodiment, the number of consecutive frames not erased required to cause a transition from state 503 to state 500 is 2 consecutive frames not erased (or 2 good frames).

Detection of bad speech frames in accordance with the invention is based on the assumption that, when a signal is present, the probability of erasing 6 consecutive frames is very low, resulting in a bit correction level of 58. Furthermore, with no signal present, it is assumed that the probability of 2 consecutive frames not erased (good frames), while in the 45 bit correction state, is sufficient such that it will remain in this state. The bit correction state actually affects the probability of meeting the transition criteria. This is shown in the state diagram of FIG. 5.

Bad speech frame detection in accordance with the invention enables channel decoder 202 to effectively differentiate between when a signal is present and when a signal is not present. At no time is this feature more important than during discontinuous transmission (DTX) operation. As previously stated, DTX is a mode of operation where the transmitters are switched "on" (a signal is present) only for those speech frames containing information. If a speech frame does not contain information, the transmitters are switched "off" (no signal is present). DTX results in prolonged battery life of a mobile and better spectrum efficiency due to a reduction in average interference level over the air interface.

Applying the state diagram of FIG. 5 to a typical DTX scenario, channel decoder 202 would start at state 500 where first bit correction threshold is equal to 58. If transmitter 115 is "off," no signal is present and channel decoder 202 will determine if six consecutive bad speech frames have been erased. It is at this point where the single bit correction threshold typically fails during DTX operation. With a bit correction threshold of 58, state 500, as previously stated, is less likely to erase a frame of speech, or in other words, is more likely to find that a frame of speech is good. However, if no speech is present, and the Viterbi decoder 400 within channel decoder 202 (falsely) detects that a good frame of speech has been received, this frame (albeit 20 ms) can result in poor audio quality for the next 300 ms. This results in this false, good speech frame being used within the muting algorithm within the speech coder. However, by implementing the present invention, when six consecutive frames are erased (a good indication no signal is present), the bit correction threshold is changed to 45 where the Viterbi algorithm is more likely to erase the frame. Thus, if no signal is present, the algorithm is now more likely to erase the bad speech frame at state 503 than it was at state 500.

When transmitter 115 is switched "on," a signal is present. With the signal present, and now at state 503, the Viterbi algorithm is more likely to erase a good frame. Consequently, when two consecutive frames are not erased (are good), the bit correction threshold is changed from 45 to 58 which results in the Viterbi decoder 400 being less likely to erase a good frame (since there is a signal present, the frames are assumed to be good). During DTX operation, the state changes as shown in FIG. 5 are dynamically iterated depending on the mode of transmitter 115. In this manner, the quality of the audio of an end user during DTX operation is significantly improved due to a significantly lower BFI rate.

While the invention has been particularly shown and described with reference to a particular embodiment, it will be understood by those skilled in the art that various changes in form and details may be made therein without departing from the spirit and scope of the invention.

What we claim is:

1. A method of determining whether frames of information are bad and good frames of information based on multiple thresholds in a communication system, the method comprising the steps of:
    determining whether a frame of information is a bad or good frame of information based on a first bit correction threshold;
    erasing at least one frame of information determined to be a bad frame of information; and
    determining whether a frame of information is a bad or good frame of information based on a second bit correction threshold.

2. The method of claim 1 wherein the first bit correction threshold is again utilized when the second step of determining determines a number consecutive frames of information are good.

3. The method of claim 1 wherein the frames of information are one of either frames of speech information or frames of data information.

4. The method of claim 1 wherein the first or second bit correction thresholds are generated over a subset of bits within the frame of information.

5. The method of claim 1 wherein the step of erasing at least one frame of information determined to be a bad frame of information further comprises the step of erasing six consecutive frames of information determined to be bad frames of information.

6. A receiver in a communication system, the receiver comprising:
    an antenna for receiving a transmitted signal having information modulated thereon;
    a receiver, coupled to the antenna, for demodulating said received signal to produce the information; and
    a channel decoder, coupled to the receiver, for decoding a portion of the information to produce a frame of information and for implementing multiple bit correction thresholds based on a history of erasures of bad frames of information to determine whether to erase the frame of information.

7. The apparatus of claim 6 wherein the apparatus further comprises a base-station or a mobile station in a digital radiotelephone system.

8. The apparatus of claim 6 wherein the channel decoder for implementing multiple bit correction thresholds based on a history of erasures of bad frames of information further comprises a channel decoder for implementing multiple bit correction thresholds based on a number of consecutive erasures of bad frames of information.

9. The apparatus of claim 6 wherein the apparatus further comprises a speech decoder to erase the frame of information based on a status of a bad frame indication signal provided by the channel decoder.

10. The apparatus of claim 9 wherein the channel decoder for implementing multiple bit correction thresholds further comprises:
    a state machine for setting the bit correction threshold based on a monitored history of erasures of bad frames of information; and
    a comparator for comparing the bit correction threshold output from the state machine with a symbol error rate estimate for the received information and for outputting a status of the bad frame indication signal based on the comparison.

11. A channel decoder for decoding information received from a receiver, the channel decoder comprising:
    means for decoding a portion of the received information to produce a frame of information;
    means for utilizing a first or second bit correction threshold based on a history of erasure of bad frames of information; and
    means, coupled to the means for utilizing, for instructing a speech decoder to erase the frame of information based on a comparison of a symbol error rate estimate for the received information with one of either the first or second bit correction thresholds.

12. The channel decoder of claim 11 wherein the first bit correction threshold is greater than the second bit correction threshold.

13. The channel decoder of claim 12 wherein the channel decoder is less likely to instruct the speech decoder to erase the frame of information when the first bit correction threshold is utilized when compared to when the second bit correction threshold is utilized.

14. The channel decoder of claim 11 wherein the means for utilizing a first or second bit correction threshold further comprises means for transitioning from the first bit correction threshold to the second bit correction threshold when at least 2 consecutive erasures of bad frames of information occur.

* * * * *